United States Patent
Helfenstein et al.

(10) Patent No.: US 6,282,559 B1
(45) Date of Patent: Aug. 28, 2001

(54) METHOD AND ELECTRONIC CIRCUIT FOR SIGNAL PROCESSING, IN PARTICULAR FOR THE COMPUTATION OF PROBABILITY DISTRIBUTIONS

(75) Inventors: Markus Helfenstein, Lucerne; Hans-Andrea Loeliger, Zürich; Felix Lustenberger, Cham; Felix Tarköy, Basel, all of (CH)

(73) Assignee: Anadec GmbH (CH)

( * ) Notice: Subject to any disclaimer, the term of this patent is extended or adjusted under 35 U.S.C. 154(b) by 0 days.

(21) Appl. No.: 09/250,331

(22) Filed: Feb. 16, 1999

(30) Foreign Application Priority Data

Feb. 17, 1998 (CH) .................................................. 375/98

(51) Int. Cl.$^7$ .............................. G06G 7/00; G06G 1/16
(52) U.S. Cl. .......................................... 708/801; 708/835
(58) Field of Search .................................. 708/801, 835, 708/603; 327/356

(56) References Cited

U.S. PATENT DOCUMENTS

| | | | |
|---|---|---|---|
| 4,374,335 | 2/1983 | Fukahori et al. | 307/521 |
| 5,059,814 | 10/1991 | Mead et al. | 307/201 |
| 5,764,559 | 6/1998 | Kimura | 364/841 |
| 6,058,411 | * 5/2000 | Boltunov | 708/603 |

FOREIGN PATENT DOCUMENTS

| | | | |
|---|---|---|---|
| 19725275 A1 | 12/1998 | (DE) | H03M/13/00 |
| 1024450 A1 | 8/2000 | (EP) | G06G/7/24 |

OTHER PUBLICATIONS

Bahl, L.R. et al., IEEE Transactions on Information Theory, pp 284–287, US IEEE, New York, Mar. 1974.

EP Search Report of Jan. 3, 2001 in EP Appl'n. No. 99101292.3, corresponding to US Appl'n. No. 09/250,331.

"Decoding of Binary Codes with Analog Networks" by Joachim Hagenauer, Proceedings of the Information Theory Workshop, San Diego, Feb. 8–11, 1998, pp 13–14

"Current–Mode Approaches to Implementing Hybrid Analogue/Digital Viterbi Decoders", A. Demosthenous and J. Taylor; Proceedings of the Third IEEE Int'l Conference on Electronics, Circuits, and Systems, 1996, vol. 1.

"General Approach to Implementing Analogue Viterbi Decoders", M. H. Shakiba et al., Electronics Letters, 1994, vol. 30 No. 22, pp 1823–1824

* cited by examiner

*Primary Examiner*—Tan V. Mai
(74) *Attorney, Agent, or Firm*—Ohlandt, Greeley, Ruggiero & Perle, LLP; George W. Rauchfuss, Jr.

(57) ABSTRACT

A circuit module for data processing comprises several first inputs ($I_{x,i}$), several second inputs ($I_{y,i}$) and several outputs ($I_{i,j}$). First transistors ($T_{i,j}$) combine the first and second inputs. Each of the first transistors ($T_{i,j}$) is connected at its emitter or source with a first input and at its base or gate with a second input. Each second input is further connected to the base or gate and the emittor or source of a second transistor ($T_i$). The currents of the outputs correspond to the product of the currents through the individual inputs. By combining the outputs sum products can be calculated, especially for computing discrete probability distributions. The combination of several circuit modules allows to solve complex signal processing tasks.

12 Claims, 10 Drawing Sheets

METHOD AND ELECTRONIC CIRCUIT FOR SIGNAL PROCESSING, IN PARTICULAR FOR THE COMPUTATION OF PROBABILITY DISTRIBUTIONS

CROSS REFERENCE TO RELATED APPLICATIONS

This application claims the priority of Swiss patent application 375/98, filed Feb. 17, 1998, the disclosure of which is incorporated herein by reference in its entirety.

BACKGROUND OF THE INVENTION

The invention relates to a method and a circuit for the calculation of at least one discrete probability distribution.

Many signal processing algorithms consist essentially of elementary sum-product computations with quantities that are (or can be viewed as representing) probability distributions.

It is therefore an object of the present invention to implement these elementary computations by means of simple electronic circuits.

BRIEF SUMMARY OF THE INVENTION

Now, in order to implement these and still further objects of the invention, which will become more readily apparent as the description proceeds, the invention manifested by a method for the calculation of at least one discrete probability distribution $[p(Z_1), \ldots, p(z_k)]$, $k \geq 2$, from discrete probability distributions $[p(x_1), \ldots, p(x_m)]$, $m \geq 2$, and $[p(y_1), \ldots, p(y_n)]$, $n \geq 2$, according to the formula $p(z) = \gamma \Sigma_x \Sigma_y p(x) p(y) f(x, y, z)$ with at least one given $\{0,1\}$-valued function $f(x, y, z)$ and with a scaling factor $\gamma$ by means of an electronic circuit, wherein said electronic circuit comprises a first and a second circuit section, the first circuit section comprising m current inputs $(I_{x,1} \ldots I_{x,m})$ for $[p(x_1), \ldots, p(x_m)]$ and n current inputs $(I_{y,1} \ldots I_{y,n})$ for $[p(y_1), \ldots, p(y_n)]$, m·n transistors $T_{i,j}$, $i=1 \ldots m$, $j=1 \ldots n$, wherein an emitter or a source of transistor $T_{i,j}$ is connected to the current input for $p(x_i)$ and a base or a gate of transistor $T_{i,j}$ is connected to the current input for $p(y_j)$, additional n transistors $T_j$, $j=1 \ldots n$, wherein a base or gate and a collector or drain of transistor $T_j$ is connected to the current input for $p(y_j)$ and an emitter or source is connected to a reference voltage; wherein the second circuit section comprises k current outputs for $[P(z_1), \ldots, p(z_k)]$; said method comprising the steps of summing the collector or drain currents of said transistors $T_{i,j}$ corresponding to the required product terms $p(x_i)p(y_j)$ and copying those currents that correspond to multiply used product terms.

In another aspect of the invention, the invention relates to a circuit for signal processing comprising several circuit sections, each circuit section having m inputs $x_1, \ldots, x_m$ and n inputs $y_1, \ldots, y_n$, $m \geq 2$, $n \geq 2$ and m·n transistors $T_{i,j}$, $i=1 \ldots m$, $j=1 \ldots n$, wherein the emitter or source of transistor $T_{i,j}$ is connected to the input $x_i$ and the base or gate of transistor $T_{i,j}$ is connected to input $y_i$, wherein each circuit section further comprises n transistors $T_j$, $j=1 \ldots n$, wherein the base or gate and the collector or drain of transistor $T_j$ is connected to the current input for $p(y_j)$ and the emitter or source is connected to a fixed reference voltage; wherein m, n and k can be different for differing circuit sections, wherein several circuit sections are connected in such a way that the inputs $x_1, \ldots, x_m$ or $y_1, \ldots, y_n$ of one circuit section are connected to the collector or drain of the transistors $T_{i,j}$ of another circuit section according a connection pattern, wherein an input $x_i$ or $y_j$ can be connected to several transistors $T_{i,j}$ of the other circuit section, and wherein such connection is implemented directly or via current mirrors and/or vector scaling circuits and/or switches and/or delay elements, and wherein the circuit comprises at least two differing circuit sections and/or at least two differing connection patterns between circuit sections.

In yet another aspect, the invention relates to a method for the calculation of at least one discrete probability distribution $[p(z_1), \ldots, p(z_k)]$, $k \geq 2$, from discrete probability distributions $[p(x_1), \ldots, p(x_m)]$, $m \geq 2$, and $[p(y_1), \ldots, p(y_n)]$, $n \geq 2$, according to the formula $p(z) = \gamma \Sigma_x \Sigma_y p(x) p(y) f(x, y, z)$ with at least one given $\{0,1\}$-valued function $f(x, y, z)$ and with a scaling factor $\gamma$ by means of an electronic circuit, wherein said electronic circuit comprises a first and a second circuit section, the first circuit section comprising m current inputs $(I_{x,1} \ldots I_{x,m})$ for $[p(x_1), \ldots, p(x_m)]$ and n current inputs $(I_{y,1} \ldots I_{y,n})$ for $[p(y_1), \ldots, p(y_n)]$, m·n transistors $T_{i,j}$, $i=1 \ldots m$, $j=1 \ldots n$, wherein an emitter or a source of transistor $T_{i,j}$ is connected to the current input for $p(x_i)$ and a base or a gate of transistor $T_{i,j}$ is connected to the current input for $p(y_j)$, additional n transistors $T_j$, $j=1 \ldots n$, wherein a base or gate and a collector or drain of transistor $T_j$ is connected to the current input for $p(y_j)$ and an emitter or source is connected to a reference voltage; wherein the second circuit section comprises k current outputs for $[p(z_1), \ldots, p(z_k)]$; said method comprising the steps of summing the collector or drain currents of said transistors $T_{i,j}$ corresponding to the required product terms $p(x_i)p(y_j)$, copying those currents that correspond to multiply used product terms and using said method for calculating a problem selected from the group of separating interfering digital signals; separating users in multi-access communication systems; equalization of digital data; combined equalization, user separation and decoding of coded, digital signals; calculating at least some metric vectors in a sum product algorithm; decoding an error correcting code; decoding encoded data; source coding; carrying out a forward-backward algorithm in a hidden Markov model; and carrying out probability propagation in a Bayesian network.

The method according to the invention exploits the fact that the described circuit is topologically closely related to the mathematical structure of the probability distribution that is to be computed and that it can easily be combined with further circuits to form larger networks.

The transistors in the claimed circuits may not only be FET or bipolar transistors, but also "super transistors" including, e.g., Darlington transistors or cascodes.

If several discrete probability distributions corresponding to several $\{0,1\}$-valued functions are to be calculated from the same input values, all product terms are preferably calculated only once in the first circuit section, wherein the different sums for the individual functions are calculated in the second circuit section. Currents of multiply used product terms can e.g. be copied in current mirrors.

The circuit according to the present invention may comprise several circuit sections that are combined according to some connection patterns. By a suitable choice of the circuit sections and of the connection patterns, various complex signal processing tasks can be carried out. For assessing equality of such connection patterns, any intermediate current mirrors or any vector scaling circuits between the sub-circuits are to be disregarded.

Due to its topological simplicity and its scalability, the circuit technology of the present invention allows highly efficient implementation.

The invention is particularly suited to the computation of metric vectors in a sum-product algorithm, to the decoding of error correcting codes or coded modulation schemes, and to further tasks that are mentioned below.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

In the following, we first explain the basic transistor circuit for the sum-product generation, then specific embodiments, combinations and applications of this circuit are discussed.

Transistor Circuit for Elementary Sum-product Computation

By a "discrete probability distribution" we mean, here and in the sequel, an n-tuple ("vector") of nonnegative real numbers that add up to one. As will be detailed in Sections "Factor Graphs and the Sum-Product Algorithm" and "Applications", many signal processing algorithms can be decomposed into elementary computations of the following kind: a discrete probability distribution [p($z_1$), . . . , p($z_k$)], k≧2, is computed from the discrete probability distributions [p($x_1$), . . . , p($x_m$)], m≧2, and [p($y_1$), . . . , p($y_n$)], n≧2, according to the formula $$p(z_h)=\gamma\Sigma_{i=1 \ldots m}\Sigma_{j=1 \ldots n}p(x_i)p(y_j)f(x_i, y_j, z_h), h=1 \ldots k, \quad (1)$$

where f(x, y, z) is a {0, 1}-valued function and where γ is a suitable scaling factor.

Figure 1:
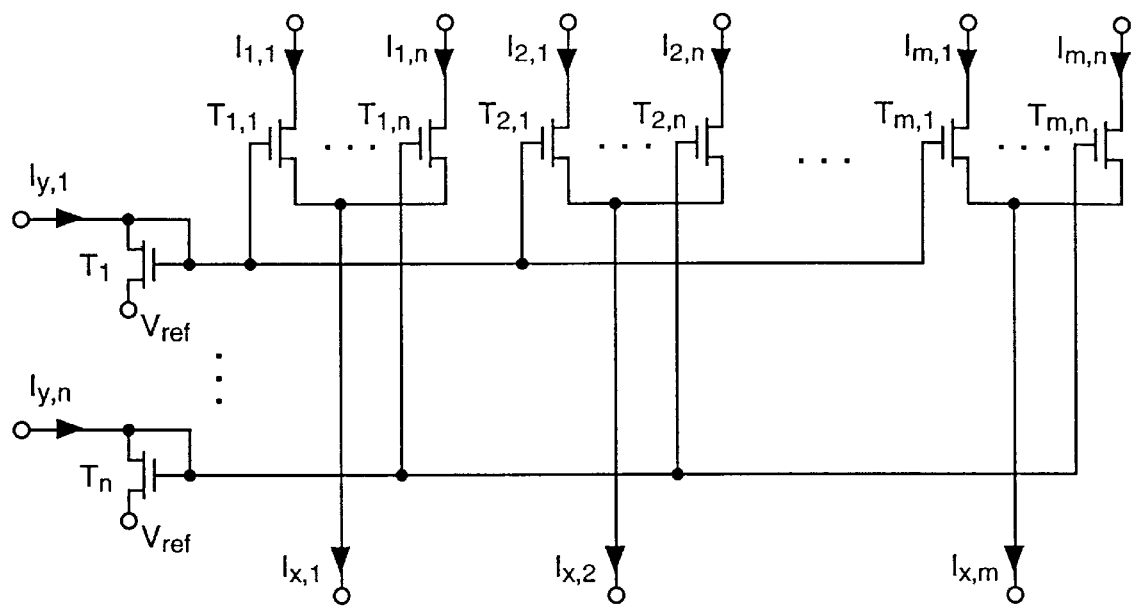
FIG. 1 is a circuit for the computation of the products p($x_i$)p($y_j$)

A key element of the technology is the simultaneous computation of the products p($x_i$)p($y_j$) in (1) by the circuit of FIG. 1. For the following description of that circuit, the transistors in FIG. 1 are assumed to be voltage-controlled current sources, whose drain current (in saturation) depends from the gate-source voltage according to $$I_{drain}=I_0 \cdot e^{\kappa(V_{gate}-V_{source})}. \quad (2)$$

This holds, in particular, for MOS transistors in the sub-threshold mode, but also (with emitter, base, and collector instead of source, gate, and drain) for bipolar transistors. The inputs to the circuit in FIG. 1 are the currents $I_{x,i}$, i=1 . . . m and $I_{y,j}$, j=1 . . . n, which are assumed to be determined by external circuitry (not shown). The outputs of the circuit are the currents $I_{i,j}$, i=1 . . . m, j=1 . . . n. We have $$I_{i,j}=I_{x,i} \cdot I_{y,j}/I_y \quad (3)$$

or, more symmetrically, $$I_{i,j}/I_{tot}=(I_{x,i}/I_x) \cdot (I_{y,j}/I_y) \quad (4)$$

with $I_x=I_{x,1}+I_{x,2}+\ldots +I_{x,m}$, $I_y=I_{y,1}+I_{y,2}\ldots +I_{y,n}$ and $I_{tot}=I_{1,1}+I_{1,2}+\ldots +I_{m,n}=I_x$. For the derivation of (3), let $V_{x,i}$, i=1 . . . m, and $V_{y,j}$, j=1 . . . n, be the potentials at the corresponding input terminals. On the one hand, we have $$I_{i,j}/I_{x,i} = I_{i,j}/(I_{i,1} + I_{i,2} + \ldots + I_{i,n}) \quad (5)$$

$$= I_0 \cdot e^{\kappa(V_{y,j}-V_{x,i})}/I_0 \cdot e^{\kappa(V_{y,1}-V_{x,i})} + \ldots + I_0 \cdot e^{\kappa(V_{y,n}-V_{x,i})} \quad (6)$$

$$= e^{\kappa V_{y,j}}/(e^{\kappa V_{y,1}} + \ldots + e^{\kappa V_{y,n}}) \quad (7)$$

and on the other hand, we have $$I_{y,j}/I_y = I_{y,j}/(I_{y,1} + I_{y,2} + \ldots + I_{y,n}) \quad (8)$$

$$= I_0 \cdot e^{\kappa(V_{y,j}-V_{ref})}/I_0 \cdot e^{\kappa(V_{y,1}-V_{ref})} + \ldots + I_0 \cdot e^{\kappa(V_{y,n}-V_{ref})} \quad (9)$$

$$= e^{\kappa V_{y,j}}/(e^{\kappa V_{y,1}} + \ldots + e^{\kappa V_{y,n}}). \quad (10)$$

Equations (7) and (10) yield (3).

For the computation of (1), all inputs and outputs are thus represented as current vectors. The circuit of FIG. 1 simultaneously provides all the products p($x_i$)p($y_j$) as the currents $I_{i,j}$. The summation of the required terms in (1) is then easily accomplished by adding the respective currents. If some particular term p($x_i$)p($y_j$) is used more than once, the corresponding current $I_{i,j}$ is first copied a corresponding number of times (see, e.g., FIG. 6).

Figure 2:
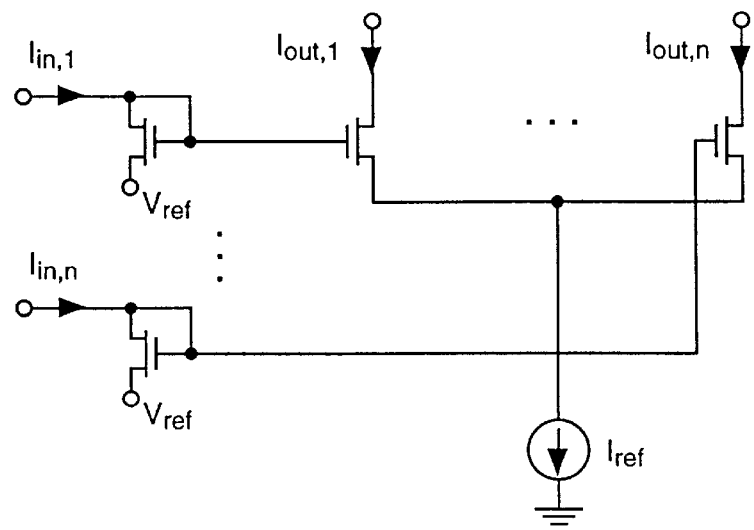
FIG. 2 is a circuit diagram of a vector scaling circuit.

The scaling factor γ in (1) can, in principle, be ignored since any two current vectors that differ only by a scale factor represent the same probability distribution. However, for proper operation of the circuits, current vectors sometimes need to be scaled to some prescribed level, which can be done by the circuit of FIG. 2. As a special case, with m=1, of the circuit of FIG. 1, its function is given by $$I_{out,i}=I_{ref}I_{in,i}/(I_{in,1}+\ldots +I_{in,n}). \quad (11)$$

Examples of Specific Modules

For the discussion of particular circuit modules as described above, the corresponding binary function f(x, y, z)

is conveniently represented by a trellis diagram. Such a trellis diagram for a {0, 1}-valued function is a bipartite graph with labeled edges defined as follows:

The left-hand nodes correspond to the possible values of x.

The right-hand nodes correspond to the possible values of z.

For every combination x, y, z with f(x, y, z)=1, there is an edge from node x to node z that is labeled with y.

Figure 3:
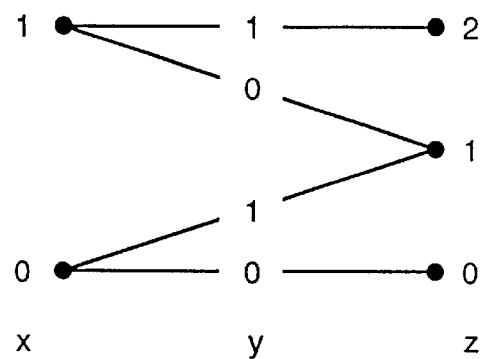
FIG. 3 is a trellis diagram of a binary-valued function f(x, y, z)

Note that the trellis diagram completely determines f(x, y, z). E.g., let x and y be binary variables, let z be a ternary variable, and let f(x, y, z) be defined by the trellis diagram of FIG. 3.

Figure 4:
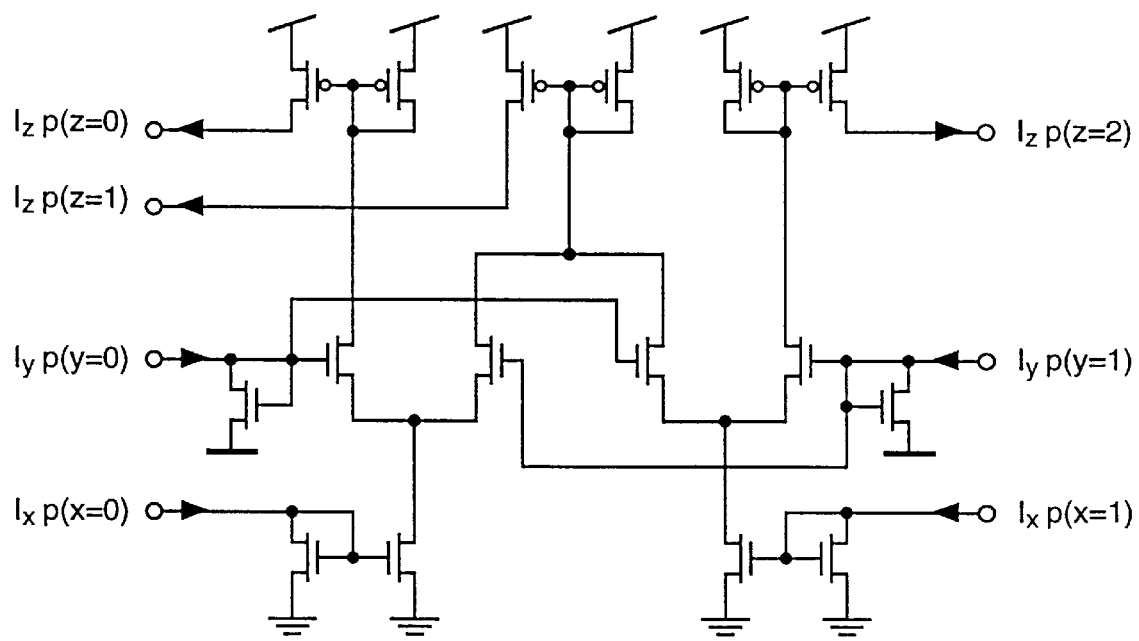
FIG. 4 is a circuit diagram for the computation of equation (1) for f(x, y, z) as in FIG. 3.

For this example, FIG. 4 shows a circuit for the computation of (1) as described above. According to (3), the output currents are $$I_z p(z=0)=I_x p(x=0)p(y=0) \quad (12)$$

$$I_z p(z=1)=I_x p(p(x=0)p(y=1)+p(x=1)p(y=0)) \quad (13)$$

$$I_z p(z=2)=I_x p(x=1)p(y=1) \quad (14)$$

with $I_z=I_x$. As an extension to the circuit of FIG. 1, all input currents and all output currents are reflected by current mirrors, which makes the circuit freely cascadable with similar circuit modules. The structure of the trellis diagram is obvious in the topology of the circuit.

Figure 5:
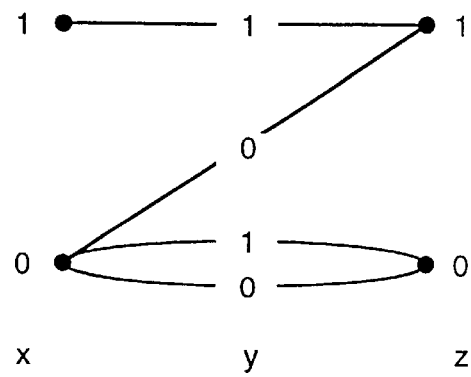
FIG. 5 is a trellis diagram of (the indicator function of) the relation x=y·z.
Figure 6:
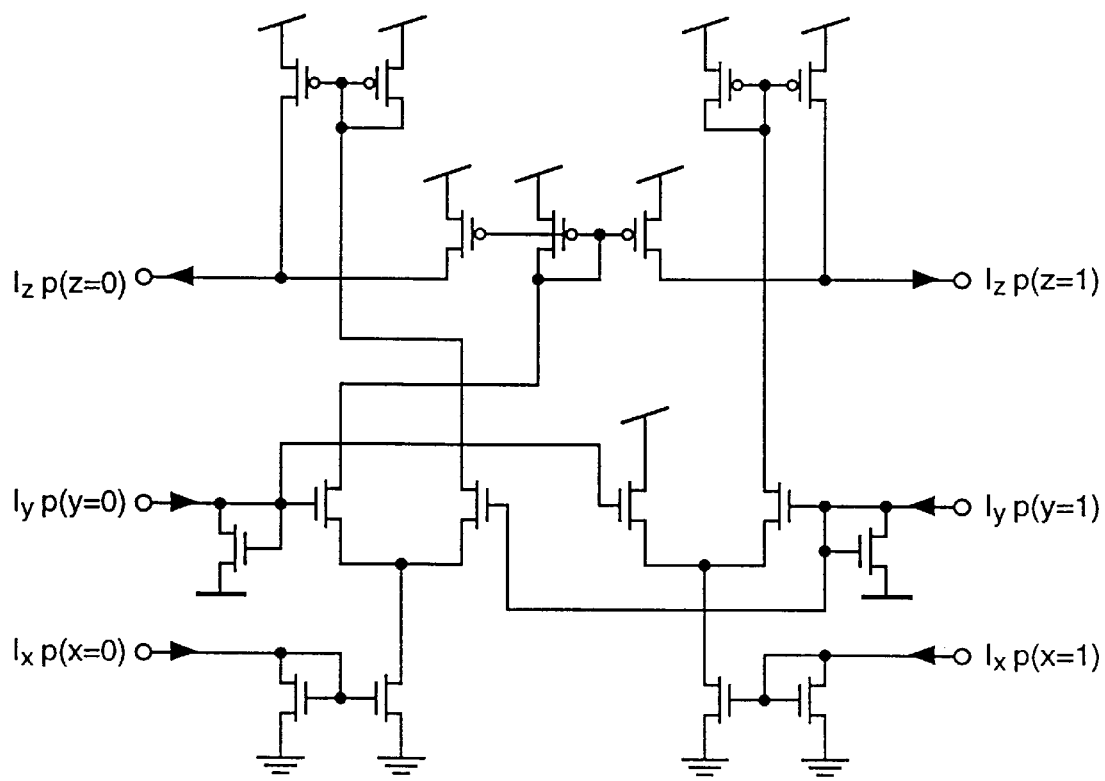
FIG. 6 is a circuit diagram for the computation of equation (1) for f(x, y, z) as in FIG. 5.

For another example, let x, y, and z be binary variables and let f(x, y, z)=1 if x=y·z and f(x, y, z)=0 in all other cases. FIG. 5 shows the corresponding trellis diagram and FIG. 6 shows the corresponding circuit for the computation of (1).

Figure 7:
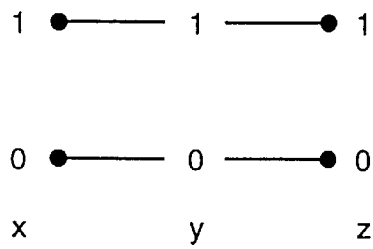
FIG. 7 is a trellis diagram of (the indicator function of) the relation x=y=z.
Figure 8:
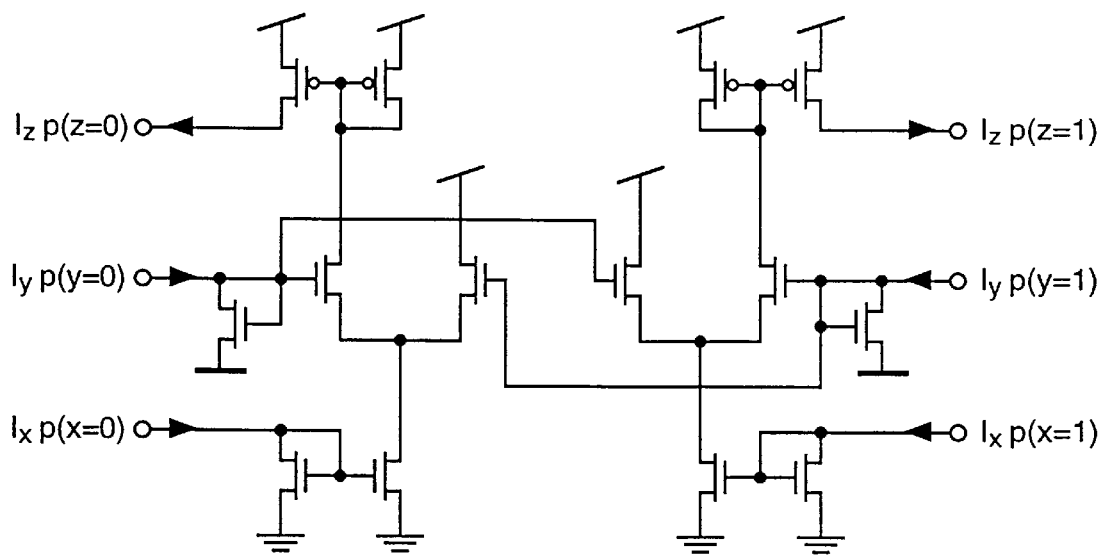
FIG. 8 is a circuit diagram for the computation of equation (1) for f(x, y, z) as in FIG. 7.

An important special case is the trellis diagram of FIG. 7. (The corresponding function f(x, y, z) is given by f(x, y, z)=1 if and only if x=y=z.) The corresponding circuit is shown in FIG. 8.

Figure 9:
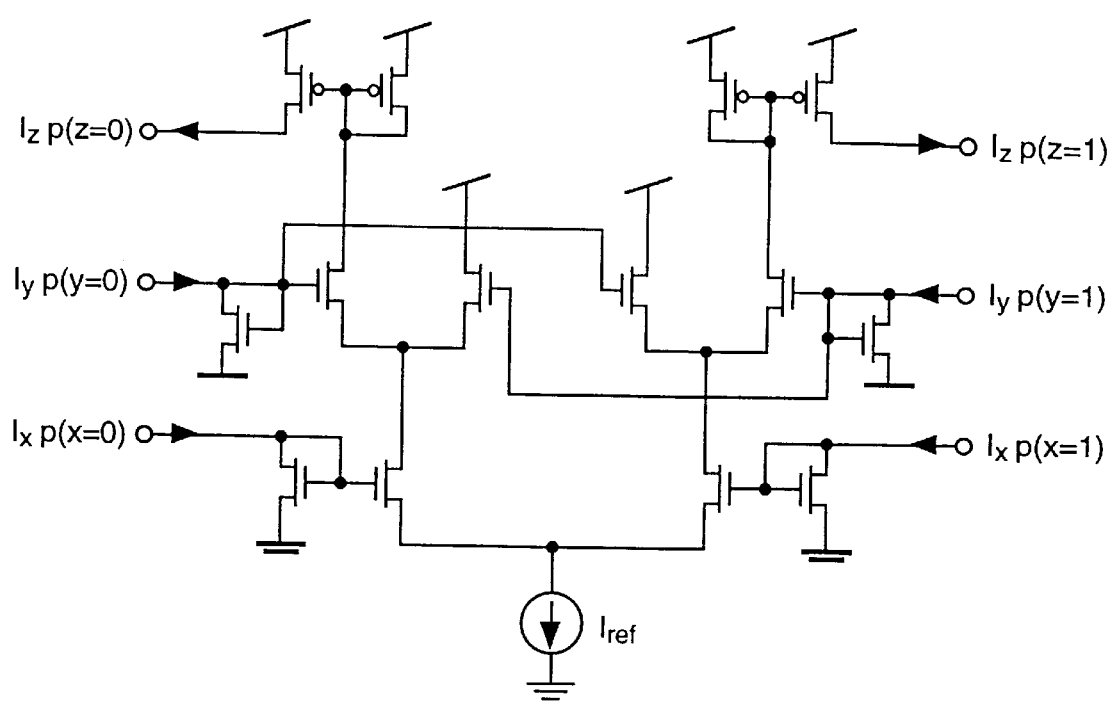
FIG. 9 is a circuit diagram of an extended version of the circuit of FIG. 8 with integrated vector current scaling.

A network of such modules is a versatile signal processing engine. If necessary, vector scaling circuits (FIG. 2) can either be inserted between such modules or be integrated into such modules (e.g., as in FIG. 9). The connection between the modules may also comprise controlled switches or delay elements. If the supply voltage is sufficiently high, such modules can also be stacked upon each other. Further variations of the circuit arise from using also "upside-down" modules, where the n-channel transistors (or npn-transistors) in FIG. 1 are replaced by p-channel transistors (or pnp-transistors, respectively). Some of the transistors may also be realized as "super transistors" such as, e.g., Darlington transistors or cascodes.

Application Example: a Decoder Circuit for a Trellis Code

Figure 10:
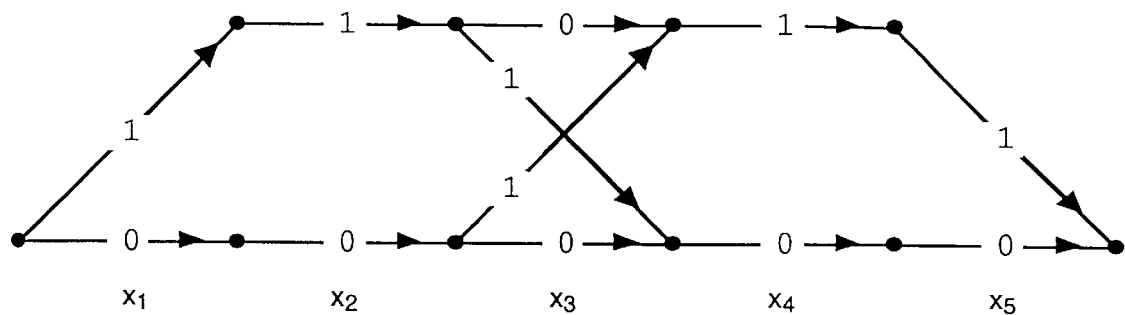
FIG. 10 is a trellis diagram for a simple error correcting code.

Consider the error correcting code that consists of the following four codewords: [0, 0, 0, 0, 0], [0, 0, 1, 1, 1], [1, 1, 1, 0, 0], [1, 1, 0, 1, 1]. The first and the third bit (bold face) are "free" information bits, the other bits are check bits. FIG. 10 shows a trellis diagram for that code. The trellis diagram consists of five sections, each of which (in this example) corresponds to one code bit. Every path from the start node (leftmost node) to the terminal node (rightmost node) corresponds to one codeword.

The job of the decoder is to convert a received "noisy" word $y=[y_1, Y_2, \ldots, Y_5]$ back into a clean codeword (or at least to recover the information bits). Let the noise be modeled as a "discrete memory-less channel":

$$p(y_1, y_2, \ldots, y_5|x_1, x_2, \ldots, x_5)=p(y_1|x_1)\,p(y_2|x_2)\,p(y_3|x_3)$$

$$p(y_4|x_4)\,p(y_5|x_5). \quad (15)$$

The transition probabilities $p(y_i|x_i=0)$ and $p(y_i|x_i=1)$, i=1 ... 5, are assumed to be known. The a priori probabilities for all four codewords are assumed to be equal (i.e., ¼). In the sequel, the short-hand notation $\lambda_i(b)=p(y_i|x_i=b)$ will be used. For any fixed given noisy word y, both $\lambda_i(0)$ and $\lambda_i(1)$ are thus known numbers.

The a posteriori probabilities of the four codewords are $$p(x_1=0, x_3=0|\underline{y})=\gamma\lambda_1(0)\,\lambda_2(0)\,\lambda_3(0)\,\lambda_4(0)\,\lambda_5(0) \quad (16)$$

$$p(x_1=0, x_3=1|\underline{y})=\gamma\lambda_1(0)\,\lambda_2(0)\,\lambda_3(1)\,\lambda_4(1)\,\lambda_5(1) \quad (17)$$

$$p(x_1=1, x_3=0|\underline{y})=\gamma\lambda_1(1)\,\lambda_2(1)\,\lambda_3(1)\,\lambda_4(0)\,\lambda_5(0) \quad (18)$$

$$p(x_1=1, x_3=1|\underline{y})=\gamma\lambda_1(1)\,\lambda_2(1)\,\lambda_3(0)\,\lambda_4(1)\,\lambda_5(1) \quad (19)$$

where the scaling factor $\gamma$ is determined by the condition that the sum of these four probabilities equals one. The a posteriori probabilities of the two information bits $x_1$ and $x_3$ are then given by $$p(x_1=0|\underline{y})=p(x_1=0,x_3=0|\underline{y})+p(x_1=0,x_3=1|\underline{y}) \quad (20)$$

$$p(x_1=1|\underline{y})=p(x_1=1,x_3=0|\underline{y})+p(x_1=1,x_3=1|\underline{y}) \quad (21)$$

$$p(x_3=0|\underline{y})=p(x_1=0,x_3=0|\underline{y})+p(x_1=1,x_3=0|\underline{y}) \quad (22)$$

$$p(x_3=1|\underline{y})=p(x_1=0,x_3=1|\underline{y})+p(x_1=1,x_3=1|\underline{y}). \quad (23)$$

Figure 11:
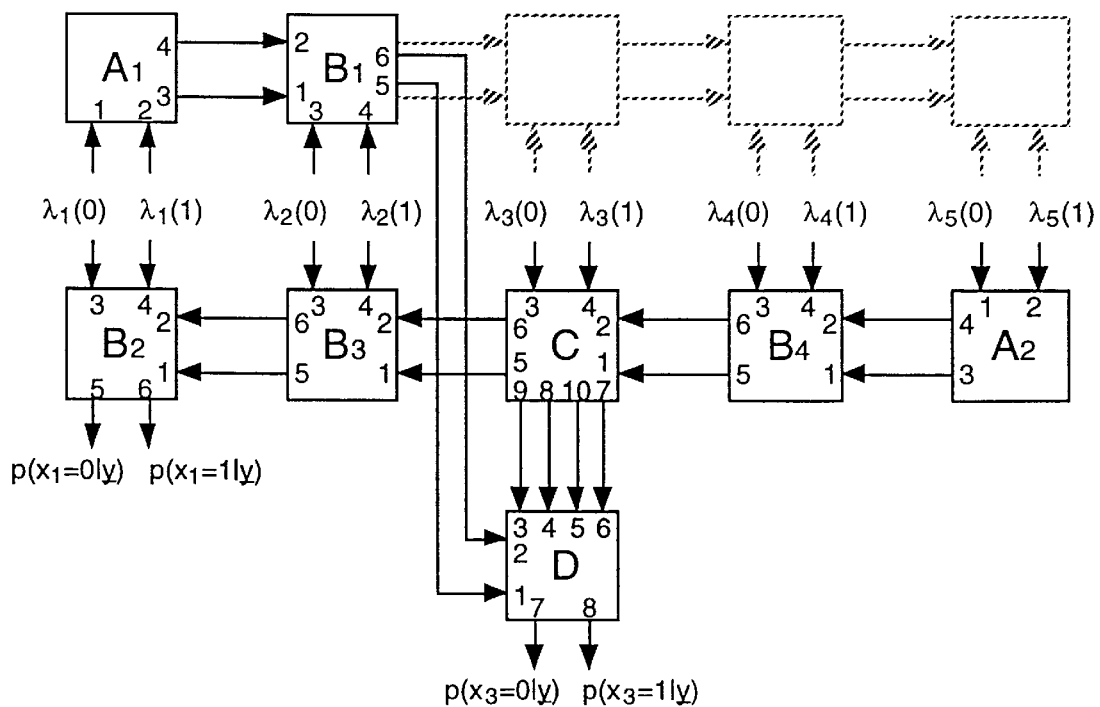
FIG. 11 is a block circuit diagram of a decoder for the code of FIG. 10.
Figure 12:
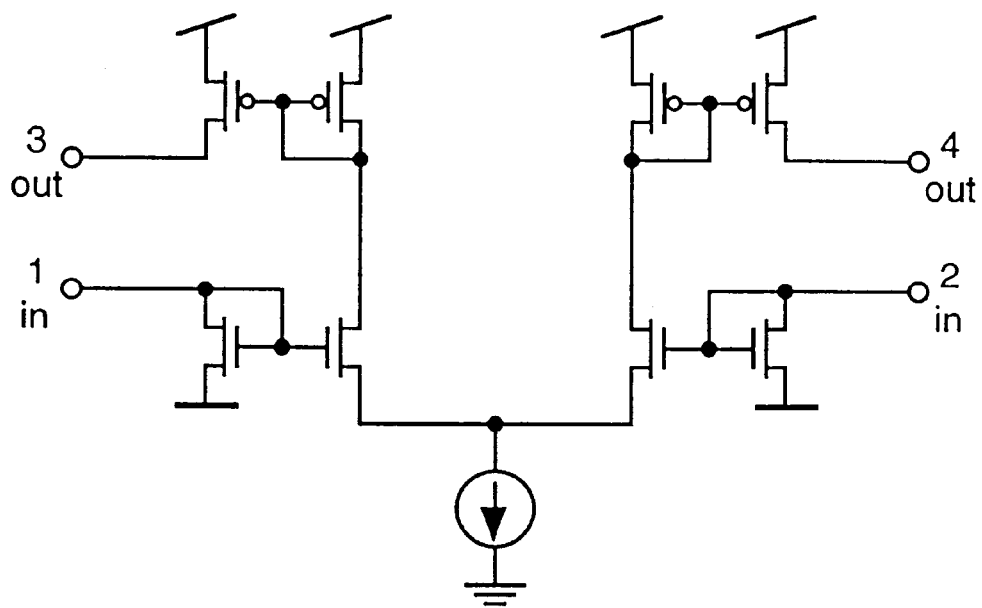
FIG. 12 is a circuit diagram for the type-A modules in FIG. 11.
Figure 13:
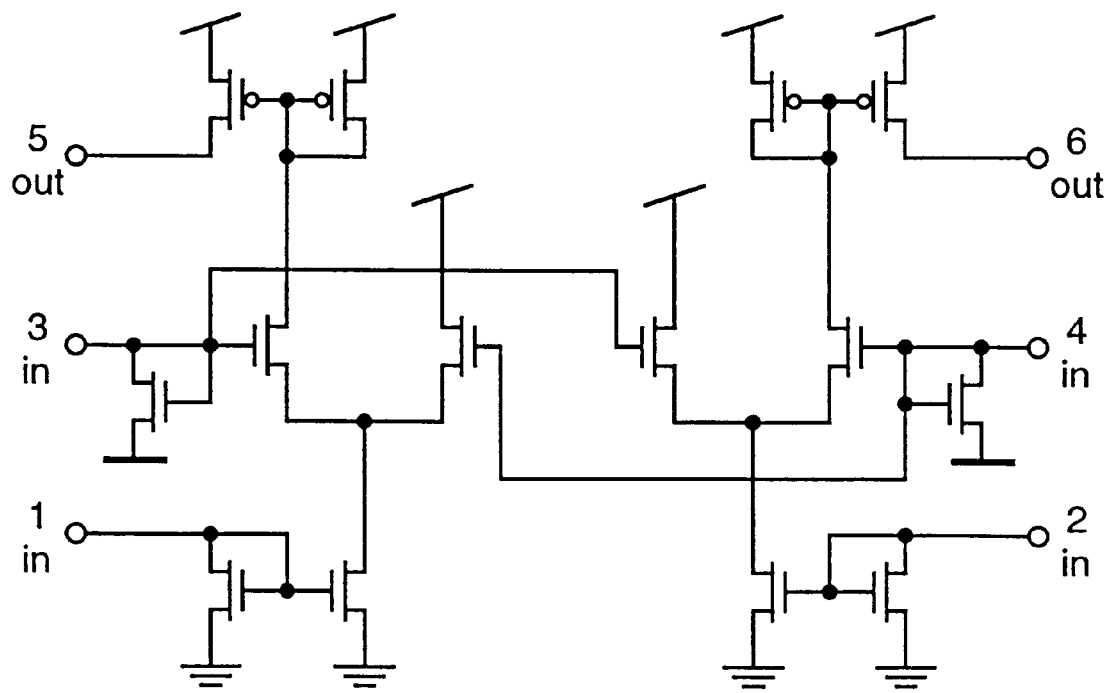
FIG. 13 is a circuit diagram for the type-B modules in FIG. 11.
Figure 14:
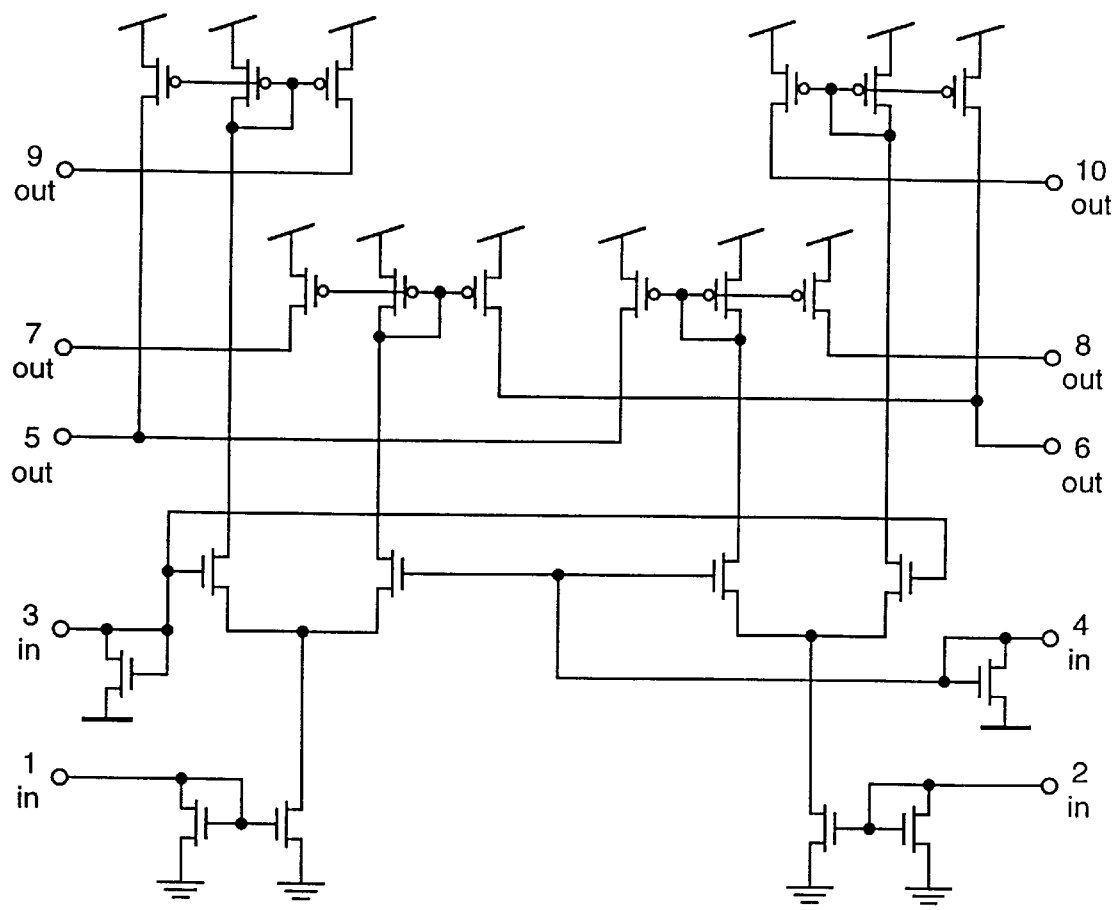
FIG. 14 is a circuit diagram for the type-C module in FIG. 11.
Figure 15:
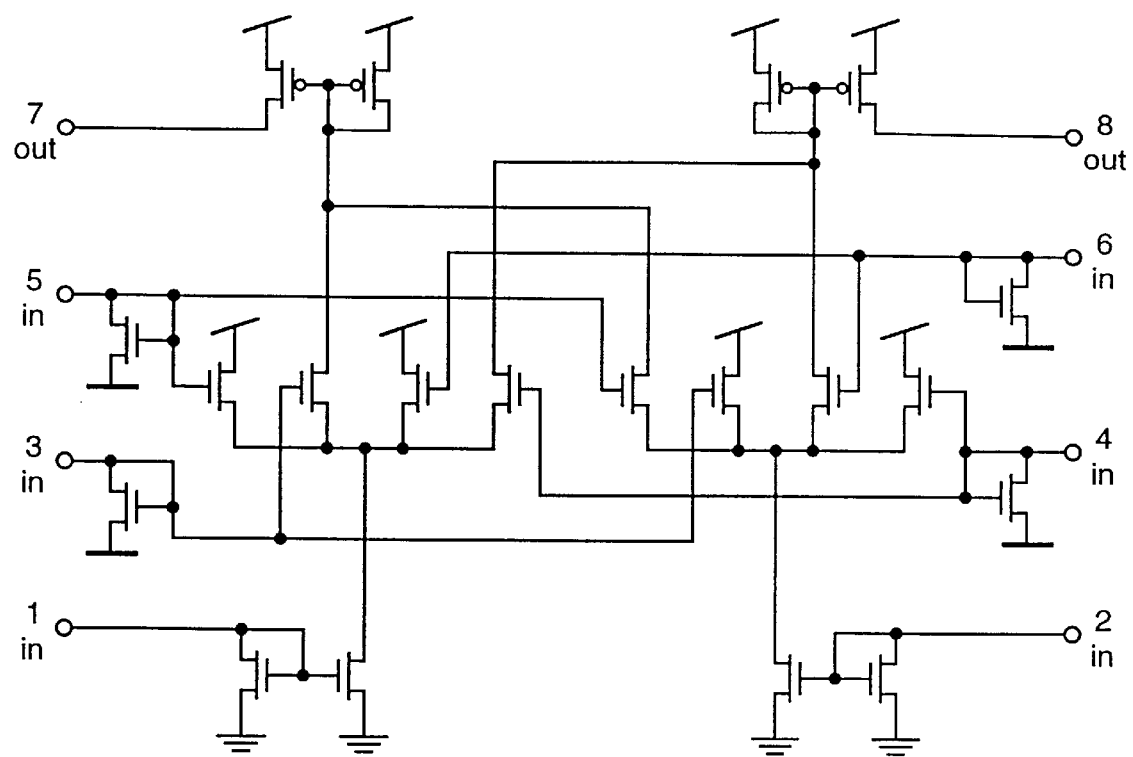
FIG. 15 is a circuit diagram for the type-D module in FIG. 11.

A preferred circuit for the computation of these probabilities is shown in FIG. 11 with the modules A ... D as in FIGS. 12 ... 15. The block circuit diagram of FIG. 11 is an immediate application of the forward-backward algorithm [Bahl et al., "Optimal decoding of linear codes for minimizing symbol error rate," IEEE Trans. Information Theory, vol.20, pp.284–287, 1974], which is a general algorithm for the computation of a posteriori probabilities in a trellis. The dashed parts in FIG. 11 indicate parts of the general forward-backward algorithm that are not needed in this example.

The following detailed description of the circuit of FIG. 11 begins with the middle row (the "backward" part). The module $A_2$ produces a scaled version of the vector $[\lambda_5(0), \lambda_5(1)]$. The module $B_4$ computes the vector $[\lambda_4(0)\lambda_5(0), \lambda_4(1)\lambda_5(1)]$ (or a scaled version thereof). The Module C computes, on the one hand, the vector $[\lambda_3(0)\lambda_4(0)\lambda_5(0), \lambda_3(1)\lambda_4(0)\lambda_5(0), \lambda_3(0)\lambda_4(1)\lambda_5(1), \lambda_3(1)\lambda_4(1)\lambda_5(1)]$, and from it, on the other hand, the vector
$[\lambda_3(0)\lambda_4(0)\lambda_5(0)+\lambda_3(1)\lambda_4(1)\lambda_5(1), \lambda_3(1)\lambda_4(0)\lambda_5(0)+\lambda_3(0)\lambda_4(1)\lambda_5(1)\,]$.

From the latter, module $B_3$ computes the vector $[\lambda_2(0)\lambda_3(0)\lambda_4(0)\lambda_5(0)+\lambda_3(1)\lambda_4(1)\lambda_5(1)), \lambda_2(1)\lambda_3(1)\lambda_4(0)\lambda_5(0)+\lambda_3(0)\lambda_4(1\lambda_5(1))]$.

From that, module $B_2$ computes the vector
$[\lambda_1(0)\lambda_2(0)\lambda_3(0)\lambda_4(0)\lambda_5(0)+\lambda_3(1)\lambda_4(1)\lambda_5(1))$
$\lambda_1(1)\lambda_2(1)\lambda_3(1)\lambda_4(0)\lambda_5(0)+\lambda_3(0)\lambda_4(1)\lambda5(1))$
which is a scaled version of $[p(x_1=0|\underline{y}), p(x_1=1|\underline{y})]$.

In the top row ("forward" part), module $A_1$ produces a scaled version of the vector $[\lambda_1(0), \lambda_1(1)]$ and module $B_1$ computes $[\lambda_1(0)\lambda_2(0)\ \lambda_1(1)\lambda_2(1)]$. In the bottom row (combination part), module C computes (a scaled version of)

$$[\lambda_1(0)\lambda_2(0)\lambda_3(0)\lambda_4(0)\lambda_5(0)+\lambda_1(1)\lambda_2(1)\lambda_3(0)\lambda_4(1)\lambda_5(1),$$

$$\lambda_1(0)\lambda_2(0)\lambda_3(1)\lambda_4(1)\lambda_5(1)+\lambda_1(1)\lambda_2(1)\lambda_3(1)\lambda_4(0)\lambda_5(0)],$$

which is a scaled version of $[p(x_3=0|\underline{y}), p(x_3=1|\underline{y})]$.

For proper functioning, additional vector scaling circuits (FIG. 2) may be needed between, or integrated into, the modules shown in FIG. 11.

The circuit of FIG. 11 does not contain any feedback loops. This need not be so. As will be made clear in the next section, circuits with many feedback loops are actually particularly powerful.

Factor Graphs and the Sum-Product Algorithm

Factor graphs and the sum-product algorithm are mathematical abstractions, by which a large number of signal processing algorithms can be described in a unified manner. A few keywords to this topic will be given below; for an in-depth treatment, see [B. J. Frey, F. R. Kschischang, H. -A. Loeliger, and N. Wiberg, "Factor Graphs and Algorithms," Proc. 35th Allerton Conference on Communication, Control, and Computing, (Allerton House, Monticello, Ill.), Sept. 29–Oct. 1, 1997].

A factor graph is a bipartite graph that represents the factorization of a "global" function of several variables into a product of "local" functions. Of particular interest are factor graphs for binary functions (whose only possible values are 0 and 1) and for probability distributions. Factor graphs for binary functions (also called "Tanner graphs" or "TWL graphs") may be viewed as generalized trellises (in coding theory) or as state realizations (system theory). Factor graphs for probability distributions may be viewed as generalization of both Markov random fields and Bayesian networks; they arise, in particular, in decoding and state-estimation problems, often as trivial extensions of a factor graph for a code or for an a priori probability distribution.

The sum-product algorithm is a generic algorithm for the (exact or approximate) computation of "marginal functions" on a factor graph. A number of algorithms in artificial intelligence and digital communications can be viewed as instances of the sum-product algorithm. Examples include the forward-backward algorithm for Hidden-Markov Models, Pearl's belief propagation algorithm for Bayesian networks, and iterative decoding of turbo codes and similar codes.

Figure 16:
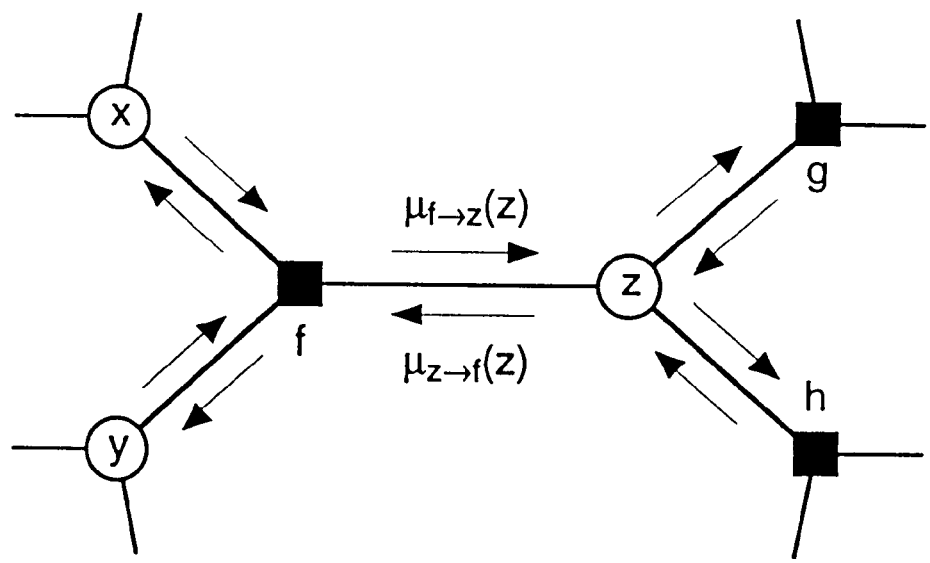
FIG. 16 is a part of a factor graph.

A part of a factor graph is shown in FIG. 16. The circles represent variables (x,y,z, . . .) and the squares represent local functions (f,g,h, . . .). The node for some function f is connected by an edge to the node for some variable x if and only if x is an argument of f. E.g., node f in FIG. 16 represents a function f(x, y, z).

In its basic form, the sum-product algorithm computes, for every edge of the factor graph, two vector signals, one for each direction, according to the following rules:

$$\mu_{f \to z}(z) := \Sigma_{x,y} f(x,y,z) \mu_{x \to f}(x) \mu_{y \to f}(y) \quad (24)$$

$$\mu_{z \to f}(z) := \mu_{g \to z}(z) \mu_{h \to z}(z) \quad (25)$$

For clarification, these rules are re-written below for the special case that all variables are binary. Rule (24) then becomes:

$$\mu_{f \to z}(0) = f(0, 0, 0)\mu_{x \to f}(0)\mu_{y \to f}(0) + \quad (26)$$
$$f(0, 1, 0)\mu_{x \to f}(0)\mu_{y \to f}(1) +$$
$$f(1, 0, 0)\mu_{x \to f}(1)\mu_{y \to f}(0) +$$
$$f(1, 1, 0)\mu_{x \to f}(1)\mu_{y \to f}(1)$$

-continued
$$\mu_{f \to z}(1) = f(0, 0, 1)\mu_{x \to f}(0)\mu_{y \to f}(0) + \quad (27)$$
$$f(0, 1, 1)\mu_{x \to f}(0)\mu_{y \to f}(1) +$$
$$f(1, 0, 1)\mu_{x \to f}(1)\mu_{y \to f}(0) +$$
$$f(1, 1, 1)\mu_{x \to f}(1)\mu_{y \to f}(1)$$

Rule (25) becomes:

$$\mu_{z \to f}(0) = \mu_{g \to z}(0)\mu_{h \to z}(0) \quad (28)$$

$$\mu_{z \to f}(1) = \mu_{g \to z}(1)\mu_{h \to z}(1) \quad (29)$$

In general, a function f may have an arbitrary number of arguments and a variable x may be an argument of an arbitrary number of functions. The nodes in a factor graph are thus, in general, connected to an arbitrary number of neighbor nodes. The rules (24) and (25) have to be adapted accordingly: for a vector signal out of a node with (totally) n neighbors, the rules (24) and (25) are modified to contain n−1 factors $\mu(. . .)$ and the sum in (24) is modified to run over n−1 variables.

The vector signals $\mu(. . .)$ of the sum-product algorithm are often (scaled versions of) probability distributions in the sense of Section "Transistor circuit for elementary sum-product computation". If the factor graph satisfies the following conditions, the rules (24) and (25) have the form (1):

Function nodes for binary functions (i.e., functions taking only the values 0 and 1) have at most three neighbor nodes (arguments).

All other functions nodes have only one neighbor node (one argument).

The variable nodes have at most three neighbor nodes (as in FIG. 16).

In many applications, these conditions are met or can be met by a suitable construction of the factor graph. The rules (24) and (25) can then be computed by circuit modules as in Section "Examples of specific modules". In fact, the last of these three rules is not really necessary: the generalization of (25) to variable nodes with an arbitrary number of neighbors can still be computed by circuits as in FIG. 8 (in general, with n=m=k>=2).

The sum-product algorithm is usually carried out in discrete steps, in some applications (graphs with loops, especially for decoding turbo codes and similar codes) with many iterations. However, already the work by Wiberg et al. [N. Wiberg, H. -A. Loeliger, and R. Koetter, "Codes and iterative decoding on general graphs," European Trans. on Telecommunications, vol. 6, pp. 513–525, Sep./Oct. 1995] (see also [N. Wiberg, "Approaches to neural-network decoding of error-correcting codes," Linkoeping Studies in Science and Technology, Thesis No. 425, 1994]) was motivated by the vision of an analog decoder for error correcting codes in "neuromorphic" VLSI (in the sense of Mead [C. Mead, "Analog VLSI and Neural Systems," Addison Wesley, 1989]). That vision included, in particular, that the discrete iteration steps would be replaced by the continuous-time operation of the circuit. This idea was also pursued by Hagenauer [J. Hagenauer, "Decoding of Binary Codes with Analog Networks," IEEE Int. Workshop on Information Theory, San Diego Calif., Feb. 8–11, 1998]. The present invention goes far beyond that earlier work by the discovery of the correspondence between the rules (24) and (25) on the one hand and the circuit of FIG. 1 on the other hand.

Applications

The claimed circuit technology is suitable for most applications of the sum-product algorithm that have been described in the literature. This applies, in particular, to the decoding of error correcting codes and coded modulation, but also to belief propagation in Bayesian networks (in artificial intelligence) and to the forward-backward algorithm of Hidden-Markov Models (which is a standard algorithm in speech processing).

Figure 17:
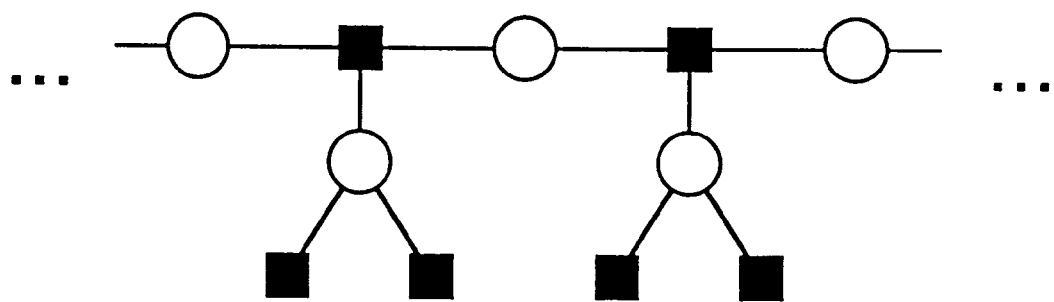
FIG. 17 is (a part of) a factor graph for a hidden-Markov model.

For that latter application, a generic factor graph that meets the conditions mentioned in Section "Factor graphs and the sum-product algorithm" is shown in FIG. 17. The squares in the top row represent $\{0,1\}$-valued functions. The squares in the bottom row represent the a priori probabilities as well as the likelihoods of the observed variables.

Another application is source coding; in particular, the transformation of discrete-time analog signals into a compressed digital representation. A standard approach in that field is based on trellis codes [Marcellin and Fischer, "Trellis coded quantization of memoryless and Gauss-Markov sources," IEEE Trans. Communications, vol.38, pp.82–93, 1990] and can be implemented with circuits of the type described in section "a decoder circuit for a trellis code". It appears likely that, in the future, more general factor graphs will be used also in this field.

Another important application is the separation of superimposed digital signals, in particular, the separation of users in multi-access communication systems [Moher, "Iterative multi-user decoder for bit-synchronous communications," IEEE Trans. Communications, to be published; see also Proc. IEEE Int. Symp. on Inform. Theory, Jun. 29–Jul. 4, 1997, Ulm/Germany, p.195], [Tarköy, "Iterative Multi-User Decoding for Asynchronous Users," Proc. IEEE Int. Symp. on Inform. Theory, Jun. 29–Jul. 4, 1997, Ulm/Germany, p.30].

Yet another application is the equalization (or deconvolution) of digital data. E.g., the distorted signals can be represented by a trellis and treated similarly as in Section "a decoder circuit for a trellis code".

By combinations of the mentioned applications, the possibility arises of constructing a complete receiver (e.g., as a combination of equalization, multi-user separation, and decoding, perhaps with feedback loops between these function blocks) in the same circuit technology.

In many of these applications, the required precision in the computation of (1) is modest. In consequence, the transistors need not be very accurate. In fact, networks of circuit modules as described above can be powerful signal processing engines even if the transistors do not behave according to (2) at all, e.g., transistors where the drain current depends quadratically on the voltage between gate and source.

Crude approximations often suffice, in particular, if the sum-product computation (1) is replaced by a maximum-product computation [B. J. Frey, F. R. Kschischang, H. -A. Loeliger, and N. Wiberg, "Factor Graphs and Algorithms," Proc. 35th Allerton Conference on Communication, Control, and Computing, (Allerton House, Monticello, Ill.), Sep. 29–Oct. 1, 1997]. Such computations arise also in applications of fuzzy logic.

While there are shown and described presently preferred embodiments of the invention, it is to be distinctly understood that the invention is not limited thereto but may be otherwise variously embodied and practiced within the scope of the following claims.

What is claimed is:

1. A method for the calculation of at least one discrete probability distribution $[p(z_1), \ldots, p(z_k)]$, $k \geq 2$, from discrete probability distributions $[p(x_1), \ldots, p(x_m)]$, $m \geq 2$, and $[p(y_1), \ldots, p(y_n)]$, $n \geq 2$, according to the formula $p(z)=\gamma \Sigma_x \Sigma_y p(x)p(y)f(x, y, z)$ with at least one given $\{0,1\}$-valued function $f(x, y, z)$ and with a scaling factor $\gamma$ by means of an electronic circuit, wherein said electronic circuit comprises a first and a second circuit section, the first circuit section comprising m current inputs $(I_{x,1} \ldots I_{x,m})$ for $[p(x_1), \ldots, p(x_m)]$ and n current inputs $(I_{y,1} \ldots I_{y,n})$ for $[p(y_1), \ldots, p(y_n)]$, m·n transistors $T_{i,j}$, i=1 ... m, j=1 ... n, wherein an emitter or a source of transistor $T_{i,j}$ is connected to the current input for $p(x_i)$ and a base or a gate of transistor $T_{i,j}$ is connected to the current input for $p(y_j)$, additional n transistors $T_j$, j=1 ... n, wherein a base or gate and a collector or drain of transistor $T_j$ is connected to the current input for $p(y_j)$ and an emitter or source is connected to a reference voltage;

wherein the second circuit section comprises k current outputs for $[p(z_1), \ldots, p(z_k)]$;

said method comprising the steps of summing the collector or drain currents of said transistors $T_{i,j}$ corresponding to the required product terms $p(x_i)p(y_j)$, and copying those currents that correspond to multiply used product terms.

2. The method of claim 1 wherein for several given $\{0,1\}$-valued functions $f_1(x, y, z)$, $f_2(x,y,z')$, $f_3(x,y,z'')$, ..., the corresponding discrete probability distributions $[p(z_1), \ldots, p(z_{k1})]$, $[p(z_1'), \ldots, p(z_{k2}')]$, $[p(z_1''), \ldots, p(z_{k3}'')]$, ..., $k1 \geq 2$, $k2 \geq 2$, $k3 \geq 2$, are calculated simultaneously by providing all product terms $p(x_i)p(y_j)$ as collector or drain currents of said transistors $T_{i,j}$ in the first circuit section and by adding the collector or drain currents of said transistors $T_{i,j}$ corresponding to the required product terms $p(x_i)p(y_j)$ in said second circuit section, wherein currents corresponding to multiply used product terms are copied.

3. The method of claim 1, wherein the at least one function $f(x, y, z)$ is defined by $f(x, y, z)=1$ for $x=y=z$ and $f(x, y, z)=0$ otherwise.

4. The method of claim 1, wherein at least one of the variables x or y is not binary, i.e. $n \geq 3$ or $m \geq 3$.

5. The method of claim 1, wherein said transistors are designed and operated in such a way that the drain current depends exponentially from the gate source voltage.

6. A circuit for signal processing comprising several circuit sections, each circuit section having m inputs $x_1, \ldots, x_m$ and n inputs $y_1, \ldots, y_n$, $m \geq 2$, $n \geq 2$ and m·n transistors $T_{i,j}$, i=1 ... m, j=1 ... n, wherein the emitter or source of transistor $T_{i,j}$ is connected to the input $x_i$ and the base or gate of transistor $T_{i,j}$ is connected to input $y_j$, wherein each circuit section further comprises n transistors $T_j$, j=1 ... n, wherein the base or gate and the collector or drain of transistor $T_j$ is connected to the current input for $p(y_j)$ and the emitter or source is connected to a fixed reference voltage;

wherein m, n and k can be different for differing circuit sections, wherein several circuit sections are connected in such a way that the inputs $x_1, \ldots, x_m$ or $y_1, \ldots y_n$ of one circuit section are connected to the collector or drain of the transistors $T_{i,j}$ of another circuit section according to a connection pattern, wherein an input $x_i$ or $y_j$ can be connected to several transistors $T_{i,j}$ of the other circuit section, and wherein such connection is implemented using a circuit selected from the group of direct connections, current mirrors, vector scaling circuits, switches and delay elements, and wherein the circuit comprises at least two differing circuit sections and/or at least two differing connection patterns between circuit sections.

7. The circuit of claim 6 comprising at least one circuit section with $m \geq 3$ and/or $n \geq 3$.

8. The circuit of claim 6, wherein the transistors $T_{i,j}$ and $T_i$ are built and operated such that the drain current depends exponentially from the gate source voltage.

9. The circuit of claim 6 further comprising current mirrors for copying at least part of the currents of the inputs and/or for copying of currents from the collector or drain of the transistors $T_{i,j}$.

10. The circuit of claim 6 further comprising at least one vector scaling circuit with a constant current source ($I_{ref}$).

11. A method for the calculation of at least one discrete probability distribution $[p(z_1), \ldots, p(z_k)]$, $k \geq 2$, from discrete probability distributions $[p(x_1), \ldots, p(x_m)]$, $m \geq 2$, and $[p(y_1), \ldots, p(y_n)]$, $n \geq 2$, according to the formula $p(z) = \gamma \Sigma_x \Sigma_y p(x) p(y) f(x, y, z)$ with at least one given $\{0, 1\}$-valued function $f(x, y, z)$ and with a scaling factor $\gamma$ by means of an electronic circuit, wherein said electronic circuit comprises a first and a second circuit section, the first circuit section comprising m current inputs ($I_{x,1} \ldots I_{x,m}$) for $[p(x_1), \ldots, p(x_m)]$ and n current inputs ($I_{y,1} \ldots I_{y,n}$) for $[p(y_1), \ldots, p(y_n)]$, m·n transistors $T_{i,j}$, $i=1 \ldots m$, $j=1 \ldots n$, wherein an emitter or a source of transistor $T_{i,j}$ is connected to the current input for $p(x_i)$ and a base or a gate of transistor $T_{i,j}$ is connected to the current input for $p(y_j)$, additional n transistors $T_j$, $j=1 \ldots n$, wherein a base or gate and a collector or drain of transistor $T_j$ is connected to the current input for $p(y_j)$ and an emitter or source is connected to a reference voltage;

wherein the second circuit section comprises k current outputs for $[p(z_1), \ldots, p(z_k)]$;

said method comprising the steps of summing the collector or drain currents of said transistors $T_{i,j}$ corresponding to the required product terms $p(x_i)p(y_j)$, copying those currents that correspond to multiply used product terms and using said method for calculating a problem selected from the group of separating interfering digital signals; separating users in multi-access communication systems; equalization of digital data; combined equalization, user separation and decoding of coded, digital signals; calculating at least some metric vectors in a sum product algorithm; decoding an error correcting code; decoding encoded data; source coding; carrying out a forward-backward algorithm in a hidden Markov model; and carrying out probability propagation in a Bayesian network.

12. The method of claim 11, comprising the step of interconnecting at least part of the circuits or circuit sections, respectively, for calculating metric vectors using a circuit selected from the group of direct connections, current mirrors, vector scaling circuits, switches and delay elements.

* * * * *